US007570723B2

(12) United States Patent
Buda (10) Patent No.: US 7,570,723 B2
(45) Date of Patent: Aug. 4, 2009

(54) MULTIPLE INPUT, MULTIPLE OUTPUT CHANNEL, DIGITAL RECEIVER TUNER

(75) Inventor: Fabien Buda, Paris (FR)

(73) Assignee: Juniper Networks, Inc., Sunnyvale, CA (US)

( * ) Notice: Subject to any disclaimer, the term of this patent is extended or adjusted under 35 U.S.C. 154(b) by 306 days.

(21) Appl. No.: 11/536,350

(22) Filed: Sep. 28, 2006

(65) Prior Publication Data

US 2007/0019539 A1    Jan. 25, 2007

Related U.S. Application Data

(63) Continuation of application No. 09/974,030, filed on Oct. 10, 2001, now Pat. No. 7,142,620.

(30) Foreign Application Priority Data

Dec. 13, 2000    (EP)    .................................. 00403506

(51) Int. Cl.
    *H04B 1/10*    (2006.01)
(52) U.S. Cl. ........................ 375/349; 375/267; 375/257
(58) Field of Classification Search ................. 375/349, 375/347, 260, 267, 299, 257
    See application file for complete search history.

(56) References Cited

U.S. PATENT DOCUMENTS 4,983,970 A    1/1991    O'Donnell et al.

(Continued)

FOREIGN PATENT DOCUMENTS

EP    0 809 403    11/1997

EP    0 841 817    5/1998

OTHER PUBLICATIONS

US International Search Authority, International Search Report, PCT/US01/45799, Mailed May 3, 2002, Washington, D.C. 20231.
F. Buda, co-pending U.S. Appl. No. 09/974,030, filed Oct. 10, 2001, "Multiple Input, Multiple Output Channel, Digital Receiver Tuner".

*Primary Examiner*—Kevin Y Kim
(74) *Attorney, Agent, or Firm*—Harrity & Harrity, LLP (57) ABSTRACT

The present invention teaches a compact and highly integrated multiple-channel digital tuner and receiver architecture, suitable for widespread field deployment, wherein each receiver demodulator channel may be remotely, automatically, dynamically, and economically configured for a particular cable, carrier frequency, and signaling baud-rate, from an option universe that includes a plurality of input cables, a plurality of carrier frequencies, and a plurality of available baud-rates. A multiple coax input, multiple channel output, digital tuner is partitioned into a multiple coax input digitizer portion and a multiple channel output front-end portion. The digitizer portion consists of N digitizers and accepts input signals from N coax cables and digitizes them with respective A/D converters. The front-end portion consists of M front-ends and provides M channel outputs suitable for subsequent processing by M respective digital demodulators. In a first clock domain, a fixed predetermined A/D sampling rate is chosen to provide oversampling of the inputs by a common integer multiple of all the symbol rates of interest. A plurality other clock domains operate at selectable sub-multiples of the first domain as required to deliver a constant number of symbol samples at the output of each front-end. At the input to each of the M front-ends is a respective input selector coupled to each of the N streams of digitized input data followed by a digital signal scaler that dynamically scales the selected incoming stream of digitized input data as a function of the signal power of the channel's associated carrier.

19 Claims, 10 Drawing Sheets

U.S. PATENT DOCUMENTS

| | | | |
|---|---|---|---|
| 5,361,091 A | 11/1994 | Hoarty et al. | |
| 5,454,007 A | 9/1995 | Dutta | |
| 5,528,582 A | 6/1996 | Bodeep et al. | |
| 5,550,869 A * | 8/1996 | Gurantz et al. | 375/340 |
| 5,579,341 A | 11/1996 | Smith et al. | |
| 5,590,156 A | 12/1996 | Carney | |
| 5,841,468 A | 11/1998 | Wright | |
| 5,864,672 A | 1/1999 | Bodeep et al. | |
| 5,878,325 A | 3/1999 | Dail | |
| 5,940,019 A | 8/1999 | Maejima | |
| 5,982,819 A | 11/1999 | Womack et al. | |
| 6,088,399 A | 7/2000 | Luz et al. | |
| 6,160,572 A | 12/2000 | Matsura | |
| 6,167,099 A | 12/2000 | Rader et al. | |
| 6,233,235 B1 | 5/2001 | Burke et al. | |
| 6,236,678 B1 | 5/2001 | Horton, Jr. et al. | |
| 6,263,195 B1 | 7/2001 | Niu et al. | |
| 6,282,184 B1 | 8/2001 | Lehman et al. | |
| 6,370,133 B1 * | 4/2002 | Kang et al. | 370/342 |
| 6,445,732 B1 | 9/2002 | Beamish et al. | |
| 6,459,679 B1 | 10/2002 | Kim | |
| 6,650,878 B1 | 11/2003 | Abe et al. | |
| 2002/0129379 A1 * | 9/2002 | Levinson et al. | 725/129 |

* cited by examiner

MULTIPLE INPUT, MULTIPLE OUTPUT CHANNEL, DIGITAL RECEIVER TUNER

CROSS REFERENCE TO RELATED APPLICATIONS

This application is a continuation of U.S. patent application Ser. No. 09/974,030 filed Oct. 10, 2001, which claims priority under 35 U.S.C. 119 based on European Patent Application No. 00403506.9, entitled "MULTIPLE INPUT, MULTIPLE OUTPUT CHANNEL, DIGITAL RECEIVER TUNER," Fabien Buda, filed Dec. 13, 2000. This application also incorporates by reference the following patent applications: Ser. No. 09/974,093, entitled "METHODS AND APPARATUS FOR EFFICIENT AND ACCURATE COARSE TIMING SYNCHRONIZATION IN BURST DEMODULATORS," Boutros et al., filed Oct. 10, 2001; and Ser. No. 09/974,332, entitled "PRECISE FREQUENCY ESTIMATION OF SHORT DATA BURSTS," Ambroise Popper, filed Oct. 10, 2001.

BACKGROUND

Hybrid Fiber Coax (HFC) networks have been used for some time to implement or upgrade metropolitan area cable television systems. In a recent improvement to HFC networks, mini-Fiber-Nodes (mFNs) have been employed to extend fiber closer to subscribers, each mFN providing bidirectional fiber-based services (including Internet access via cable modem) for multiple-tens of subscribers. mFNs are intended to be compact units deployed in the field, generally in aerial-wire or utility-pole-mount configurations, and include at least one "upstream" receiver. An upstream receiver is a receiver in the return direction, that is, in the direction from the subscriber to the cable head end. Generally multiple coaxial (coax) cables, each carrying upstream signals corresponding to a different group of subscribers, may terminate at the mFN for subsequent upstream transmission via fiber.

Each of these coax cables generally has a wide spectrum (up to 1 GHz) including a multiplex of upstream carriers located in the 5-42 MHz range. In accordance with the DOCSIS industry standard, each upstream carrier may have any symbol rate from 5 possible values (160 kBaud, 320 kBaud, 640 kBaud, 1280 kBaud, 2560 kBaud) with a modulation format of either QPSK or 16-QAM. In addition, each upstream carrier has a power spectrum density variation, with respect to a nominal value, of ±6 dB. In a worst-case scenario for the upstream receiver, the 5-42 MHz band may be filled with (up to 11) undesired carriers operating with the maximum baud rate (2560 kBaud) and a desired carrier may have the smallest value 160 kBaud. Furthermore, there may be up to a 12 dB difference in power spectrum density between the desired carrier and the others.

A digital receiver may be partitioned into a tuner and digital demodulator portions. The tuner accepts one or more broadband analog inputs having a variety of desired and undesired signals. The tuner's purpose is to isolate the desired signals and provide baseband-translated digitized equivalents for subsequent processing in the demodulator. Because quadrature modulation is common, the outputs are often provided in quadrature. The stage(s) where frequency translation is performed is (are) generally referred to as the receiver front-end. The stages where digitization is performed may be referred to as the A/D (ADC, analog to digital converter, or digitizer). The stages before and after the A/D are necessarily analog and digital, respectively.

Figure 1:
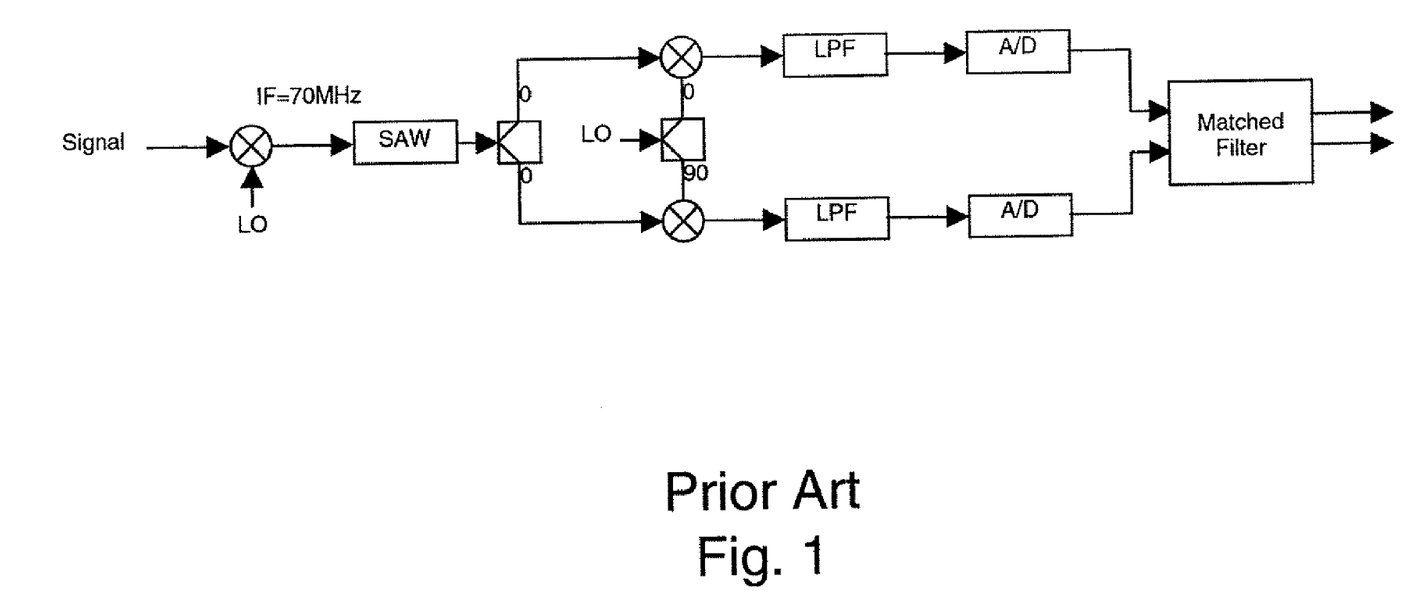
FIG. 1 illustrates a prior art tuner for a digital receiver.

A traditional tuner for an upstream digital receiver is shown in FIG. 1. A first IF (intermediate frequency) conversion combined with a SAW (surface acoustic wave) filter is used for isolating the desired carrier and suppressing any and all undesired carriers. Next, down-conversion is done in the analog domain by in-phase splitting the isolated carrier and mixing with 2 analog LOs (local oscillators). The analog LOs are provided in quadrature at the expected channel spacing. Each of the resulting quadrature signals from the mixers is then coarse anti-alias filtered in the analog domain and sampled with respective A/Ds. Matched filtering after the A/Ds is subsequently performed in the digital domain. The quadrature output signal pair of the matched filter may then be provided to the demodulator of the desired carrier/channel. There are a number of significant costs associated with each required stage of any digital receiver tuner. Costs are minimized by keeping stages as simple as possible and as few in number as necessary. Another stage cost is associated with the bit-width of the digital stages. Each additional bit in width incrementally increases the cost, size, and complexity of the associated receiver. Since the dynamic range of the signals being processed necessitates a proportional bit-width, the dynamic range should be minimized consistent with maintaining good performance. Because A/Ds are often the most complex and expensive sub-systems in the tuner, the number of required A/Ds is a key implementation consideration. In addition, each A/D has an associated clock sub-system (not shown in FIG. 1 but known to practitioners of the art) that must be configured appropriately for the carrier being digitized. The number and extent of required clock sub-systems is thus also an important implementation consideration.

Traditional digital receiver approaches have required the entirety of the above-described tuner per desired carrier/channel. In the mFN augmented HFC systems discussed above, because of the associated expense, bulk, and complexity of the traditional tuners, it has not been considered practical in widespread deployment to demodulate upstream signals locally at the mFN. Accordingly, the entire spectrum of each coax has been indiscriminately sent upstream over fiber via either analog or digital techniques for remote reconstruction and demodulation at the cable head end (or intermediate upstream location). Accordingly, when multiple coaxial cables terminate into the mfN, ether multiple expensive fibers are required or expensive WDM techniques have been used to multiplex the multiple coax spectra onto respective "lambda" wavelengths of a single fiber. In these approaches, the ultimately demodulated upstream information content is a small fraction of the transmitted upstream bandwidth.

In applications (such as upstream cable modem traffic) where there are multiple desired channels on each of generally multiple input coaxial cables, the use of traditional digital receivers (requiring one tuner per desired carrier/channel) results in a confusing proliferation of associated splitters, connectors, and couplers. Provisioning (establishing the operating configuration of) a particular upstream subscriber signal (out of many) over a particular upstream channel (again out of many) generally necessitates error-prone manual configuration of multiple coaxial cables, splitters, connectors, and couplers. This hardware also introduces new noise and signal losses. Provisioning additionally involves configuration of the receiver to accommodate the carrier frequency and baud-rate of the transmitted signal. To change the carrier frequency dynamically in the traditional digital receiver requires a very agile and very costly local oscillator. Less expensive, less agile, local oscillators generally necessitate error-prone manual configuration of component modules or component settings.

It is thus seen that there are many shortcomings to the traditional tuner approaches to multiple input, multiple output channel, digital receivers. What is needed is an optimized tuner for such receivers that is efficient, cost sensitive, flexible, and minimizes noise and signal loss. What is needed is a multiple input, multiple output channel, digital receiver tuner that reduces the number of signal processing stages, the stage bit-widths, the number of A/Ds, and the number and extent of clock sub-systems compared with traditional approaches. What is further needed is a compact and efficient multiple input, multiple output channel, digital receiver that performs local demodulation and is suitable for widespread field deployment in distributed communication systems and networks.

SUMMARY

The present invention teaches a compact and highly integrated multiple-channel digital tuner and receiver architecture, suitable for widespread field deployment, wherein each receiver demodulator channel may be remotely, automatically, dynamically, and economically configured for a particular cable, carrier frequency, and signaling baud-rate, from an option universe that includes a plurality of input cables, a plurality of carrier frequencies, and a plurality of available baud-rates. The invention thus provides substantial additional flexibility and cost savings over conventional multiple-channel receiver approaches where equivalent configuration capability would require prohibitively expensive specialized components or costly manual operations that cannot be implemented automatically. Tuners and digital receivers implemented in accordance with the present invention also minimize the number of required A/Ds, number and extent of clock sub-systems, bit-width of digital processing stages, and overall complexity. The architecture has broad generic applicability, but offers particular advantages in multiple (coax) input, multiple channel output, digital receivers. In a series of illustrative embodiments, the teachings of the invention are applied to an upstream digital receiver sub-system for use in the mFNs of an HFC network.

In accordance with a first aspect of the present invention, an illustrated multiple coax input, multiple channel output, digital tuner embodiment is partitioned into a multiple coax input digitizer portion and a multiple channel output front-end portion. The digitizer portion consists of a number (N) of digitizers and accepts input signals from N coax cables and digitizes them with respective A/D (Analog-to-Digital) converters. This creates N streams of digitized input data, respectively corresponding to each coax cable. The front-end portion consists an independent number (M) of front-ends and provides M channel outputs, which are streams of baseband-translated digital words suitable for subsequent processing by M respective demodulators. At the input to each of the M front-ends is a respective input selector coupled to each of the N streams of digitized input data. Thus, each of the M front-ends is selectively configurable to process digitized input data corresponding to any of the N coax cables. Collectively, the input selectors comprise a selector bank. The selector bank is a compact and efficient implementation that elegantly operates in the digital domain to provide functionality previously performed in the analog domain by bulky analog splitters that are problematic and costly to provision.

In accordance with a second aspect of the present invention, a variable-gain amplifier is situated before the A/D converter used to digitize the input signals for each of the N coax inputs, and a digital signal scaler is situated at the input of each of the M front-ends. The variable-gain amplifier that precedes the A/D converter operates on the entire carrier multiplex that is present on the associated coax, The amplifier gain is set as a function of the entire carrier multiplex present on the coax and not by any particular carrier. Each digital signal scaler is dedicated to a respective front-end channel and therefore has a particular respective carrier of interest. The scaler dynamically scales (shifts right or left by one or more bits) the incoming stream of digitized input data as a function of the signal power of the respective carrier in order to minimize variations in the peak magnitude of the signals processed. The scaler thus manages the dynamic range such that the digital-word bit-width of the digital front-end and subsequent demodulator stages can be minimized consistent with good performance, substantially reducing the complexity and cost of the digital receiver.

In accordance with a third aspect of the present invention, a particular clocking combination is used within the digital receiver tuner. A fixed predetermined A/D sampling rate is chosen to provide oversampling of the inputs by a common integer multiple of all the symbol rates of interest. Each oversampled input stream is digitally down-converted to baseband and processed in three sample-frequency domains. The first domain includes in common the A/Ds of the N digitizers, the baseband converters and first decimators of the M front-ends, and operates at the fixed A/D sample rate. In an optional but preferred embodiment, a second domain, including a second decimator, operates at a fixed sub-multiple of the first domain. Additional clock domains exist, including a plurality operating at selectable sub-multiples of the first domain (or second domain, if any) as required to deliver a constant number of symbol samples to each matched filter of the respective front-ends. This clocking approach enables producing matched front-end outputs using only simple filters and decimation, eliminates the need for interpolation stages, maximizes commonality of function, and provides reduced complexity and costs over previous approaches.

BRIEF DESCRIPTION OF DRAWINGS

FIGS. 4A-4D are drawings providing conceptual detail of the scaler 3000 of the tuner 1000 of FIG. 2 for four different operating cases.

FIGS. 7 and 8A-C illustrate exemplary system-level application of the present invention.

FIGS. 8A-C illustrate the routing between a Head End 10100, the Internet 10000, and Customer Premise Equipment (CPE) 8B, in a cable system architecture using the mFN/mini-CMTS 8000 of FIG. 7.

DETAILED DESCRIPTION

Figure 2:
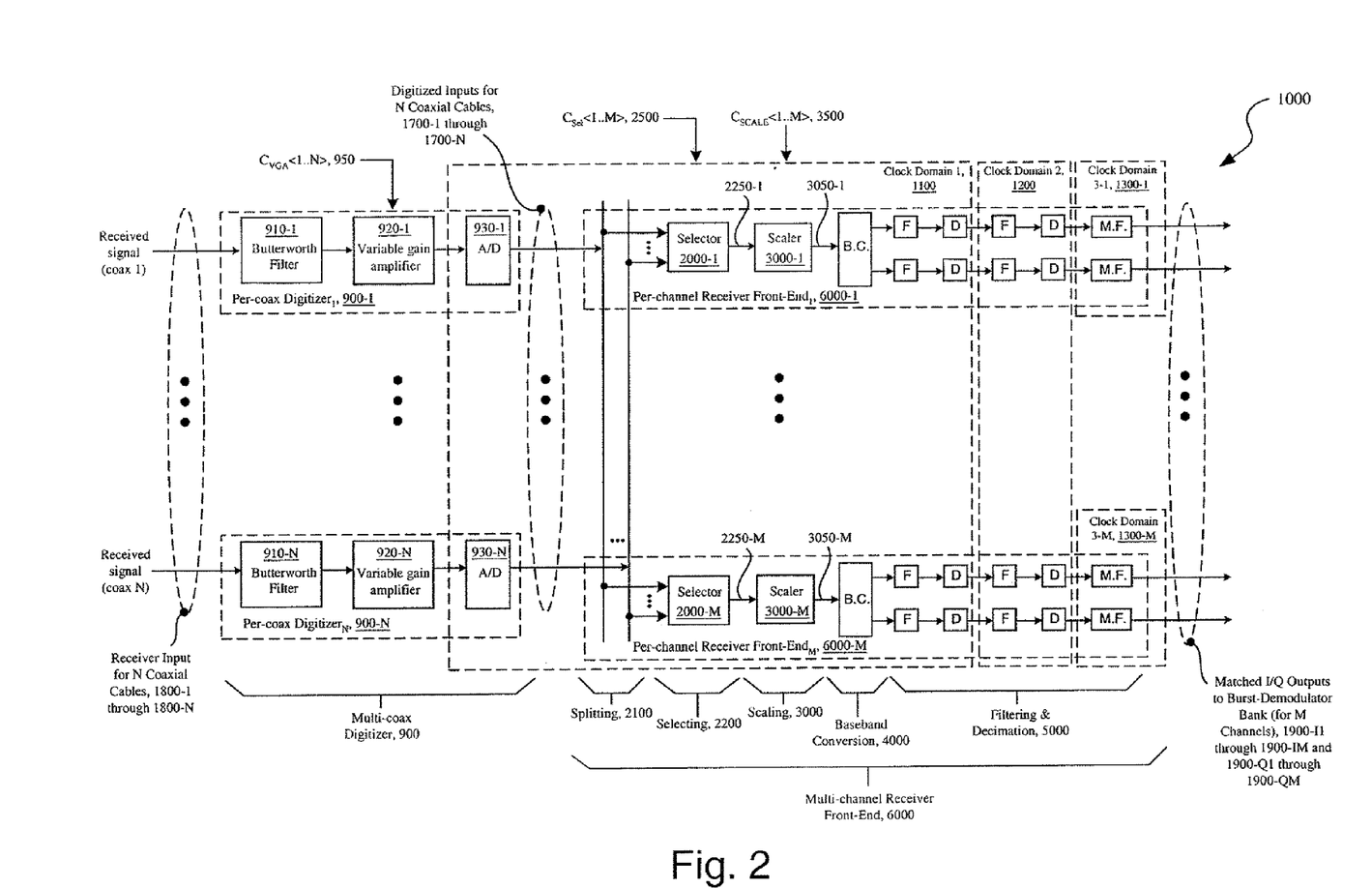
FIG. 2 illustrates a tuner 1000 for a digital receiver in accordance with the present invention, including a multiple-coax digitizer 900 and a multiple-channel front-end 6000.

FIG. 2 illustrates a multiple coax input, multiple channel output, digital tuner 1000 for a digital receiver in accordance with the present invention, including a multiple-coax digitizer portion 900 and a multiple-channel front-end portion 6000. The digitizer portion 900 consists of N Per-coax Digitizers 900-1 through 900-N, accepts input signals 1800-1 through 1800-N from N coax cables, digitizes them with respective A/D converters 930-1 through 930-N, and delivers to the front-end digitized signals 1700-1 through 1700-N. A Butterworth filter 910 and variable-gain amplifier 920 precedes each A/D converter. While a Butterworth characteristic is used in the illustrative embodiment, this choice is not critical and other low-pass filters may also be used. The variable-gain amplifier 920 is set by control 950 as a function of the entire carrier multiplex present on the amplifiers associated coax input. The front-end portion 6000 consists of M Per-channel Receiver Front-ends 6000-i through 6000-M. The functions performed by front-end 6000 include splitting 2100. selecting 2200, scaling 3000, baseband conversion 4000, and filtering and decimation 5000. Front-end 6000 provides M channel output quadrature pairs 1900-I1 through 1900-IM and 1900-Q1 through 1900-QM suitable for subsequent processing by M respective digital demodulators. Digitized signals 1700-1 through 1700-N are distributed to the individual selectors via splitting 2100, In accordance with control 2500, each selector 2000 couples a selected one of the digitized inputs to the subsequent stages of the front-end. In accordance with control 3500, the digital signal scaler 3000 dynamically scales the selected incoming stream as a function of the signal power of the channel's associated carrier.

Clock domain 1100 includes in common the A/Ds 930-1 through 930-N of the N digitizers 900-1 through 900-N and a first sub-portion-of the M front-ends, and operates at a fixed A/D sample rate chosen in accordance with a specific criteria to be discussed below. A second clock domain 1200, including a second sub-portion of the M front-ends, facilitates implementation and operates at a fixed sub-multiple of the first domain. Additional clock domains exist, including a plurality 1300-1 through 1300-M operating at selectable sub-multiples of the first domain as required to deliver a constant number of symbol samples to outputs of the front-end.

Digital Splitter

Figure 3:
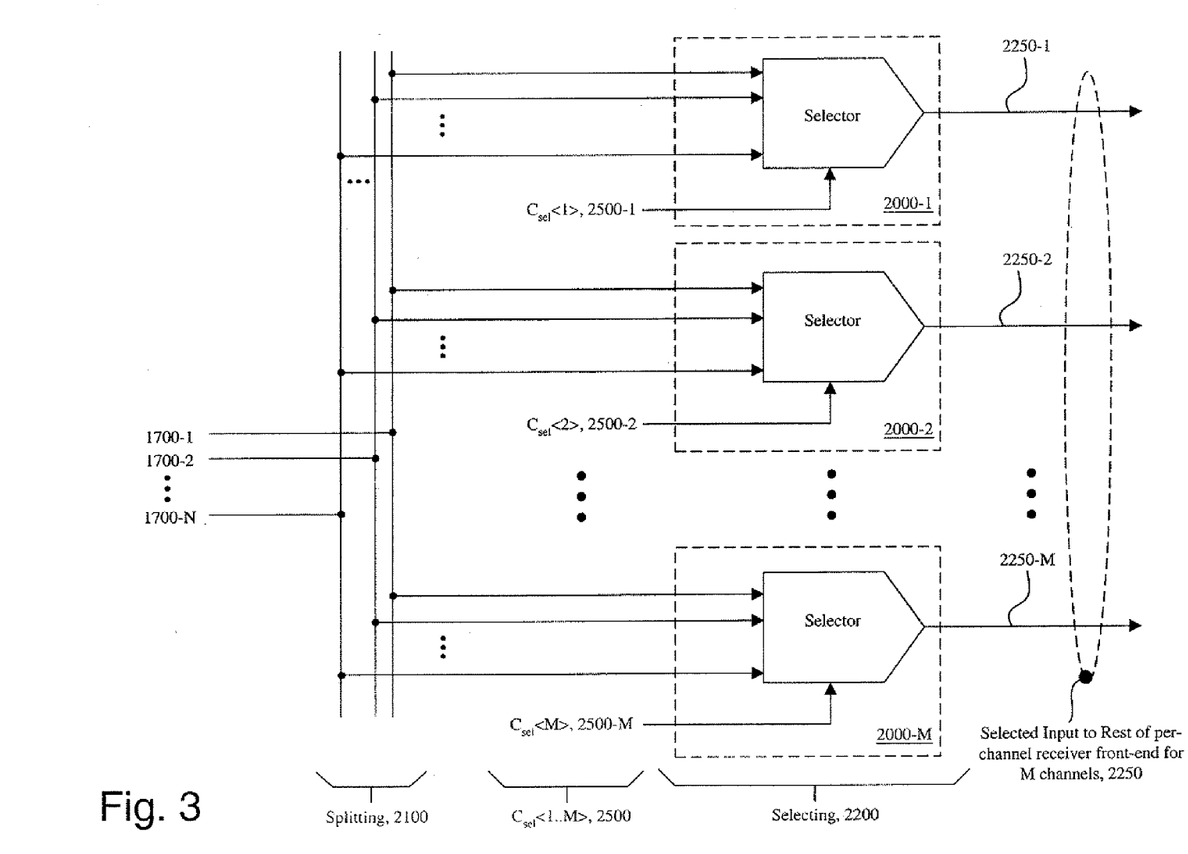
FIG. 3 is a drawing providing additional detail of the splitting 2100 and selecting 2200 function blocks of the tuner 1000 of FIG. 2.

FIG. 3 is a drawing providing additional detail of the splitting 2100 and selecting 2200 function blocks of the tuner 1000 of FIG. 2. Digitized signals 1700-1 through 1700-N are distributed to the individual selectors via splitting 2100, shown here as simple distribution interconnect. Practitioners will understand that additional well-known considerations such as buffering and attention to interconnect impedances and parasitics may be required based on implementation specifics. In accordance with control 2500, each selector 2000 couples a selected one of the digitized inputs to the subsequent stages of the front-end. Practitioners will understand that the selectors may use either encoded or uncoded controls and that the number of control bits will vary based on this choice and the number of inputs being selected. The outputs 2250-1 through 2250-M are provided to subsequent stages of the front-end.

Collectively, the input selectors comprise a selector bank. Via the selector bank, each demodulator channel is selectively configurable to process digitized input data corresponding to any of the coax cables. The selector bank elegantly operates in the digital domain to provide functionality previously performed in the analog domain by manual configuration of splitters, couplers, cables, and connectors that are problematic and costly to provision.

Thus in accordance with the present invention, a modulated input signal corresponding to a particular subscriber, and on a particular one of the coaxial cables, can be routed (sent) to any particular one of the plurality of demodulator channels. In the illustrative embodiment, the routing configuration is established during provisioning of the upstream channel for each subscriber, the input selector for each demodulator channel being controlled by digital commands transmitted from the head end. Provisioning the upstream channel in this way reduces or eliminates the manual configuration of connectors and couplers; reduces additional sources of noise and signal losses; speeds setup; reduces costs; and increases flexibility. More generally, the input selectors could be reconfigured dynamically, in response to predefined criteria, to provide fault tolerance or minimization of transient interference.

Dynamic Range and Signal Power Management

The inventors discovered that control over signal power in digital receiver front-ends is optimally managed through a cooperative combination of variable-gain amplifiers in the analog domain and digital signal scalers in the digital domain. More specifically, a variable-gain amplifier is situated before the A/D converter used to digitize the input signals for each coax, and a digital signal scaler is situated at the input of each front-end. (In accordance with the discussion above, the scaler is placed after any selector function).

The variable-gain amplifier that precedes the A/D converter operates on the entire carrier multiplex that is present on the associated coax. Recall that the output of the A/D converter may be supplied to multiple demodulator channels, each typically having a respectively unique, carrier of interest. The gain of this amplifier is considered appropriately set when the adjusted input to the A/D is such that the digitized output generally spans the dynamic range of the A/D without significant saturation. The amplifier gain is thereby set as a function of the entire carrier multiplex present on the coax and not by any particular carrier. In a particular illustrative embodiment the A/D provides a 12-bit 2's complement output. There is only 11-bits of usable precision however, and the original LSB from the A/D is ignored. The front-end subsequently operates on 11-bit 2's complement digital words.

In an illustrative tuner embodiment compatible with the DOCSIS industry standard. the power spectral density has a dynamic range of 12 dB. The modulated carrier bandwidth dynamic range, which is proportional to a maximum-to-minimum symbol rate ratio of 16, also is 12 dB. Since the product of the power spectral density and the bandwidth gives received signal power for a selected carrier, the received signal power has a 24 dB dynamic range for a selected carrier in this application. Thus, a front-end designed for this application should have 24 dB of headroom.

Unlike traditional approaches, the 24 dB of required dynamic range headroom is accomplished through use of the digital scaler in accordance with the present invention, and without additional bits over that required by the minimum signal case. More specifically, the digital signal scaler reduces the complexity and the cost of the front-end by limiting the dynamic range to the minimum necessary, while providing good performance.

Each digital signal scaler is dedicated to a respective front-end channel and therefore has a particular respective carrier of interest. The scaler dynamically scales the incoming stream of digitized input data (by selective shift toward the LSB of zero to three bits) as a function of the received nominal signal power of the respective carrier. The scaler is operated to maintain essentially the same peak signal magnitude (having 3-dB of headroom) at the input to the next stage of the rest of the front-end (the broadband conversion in the illustrative embodiment). As signals increase in amplitude, the scaler selectively shifts by a proportionally greater numbers of bits, providing increasing attenuation.

Figure 4:
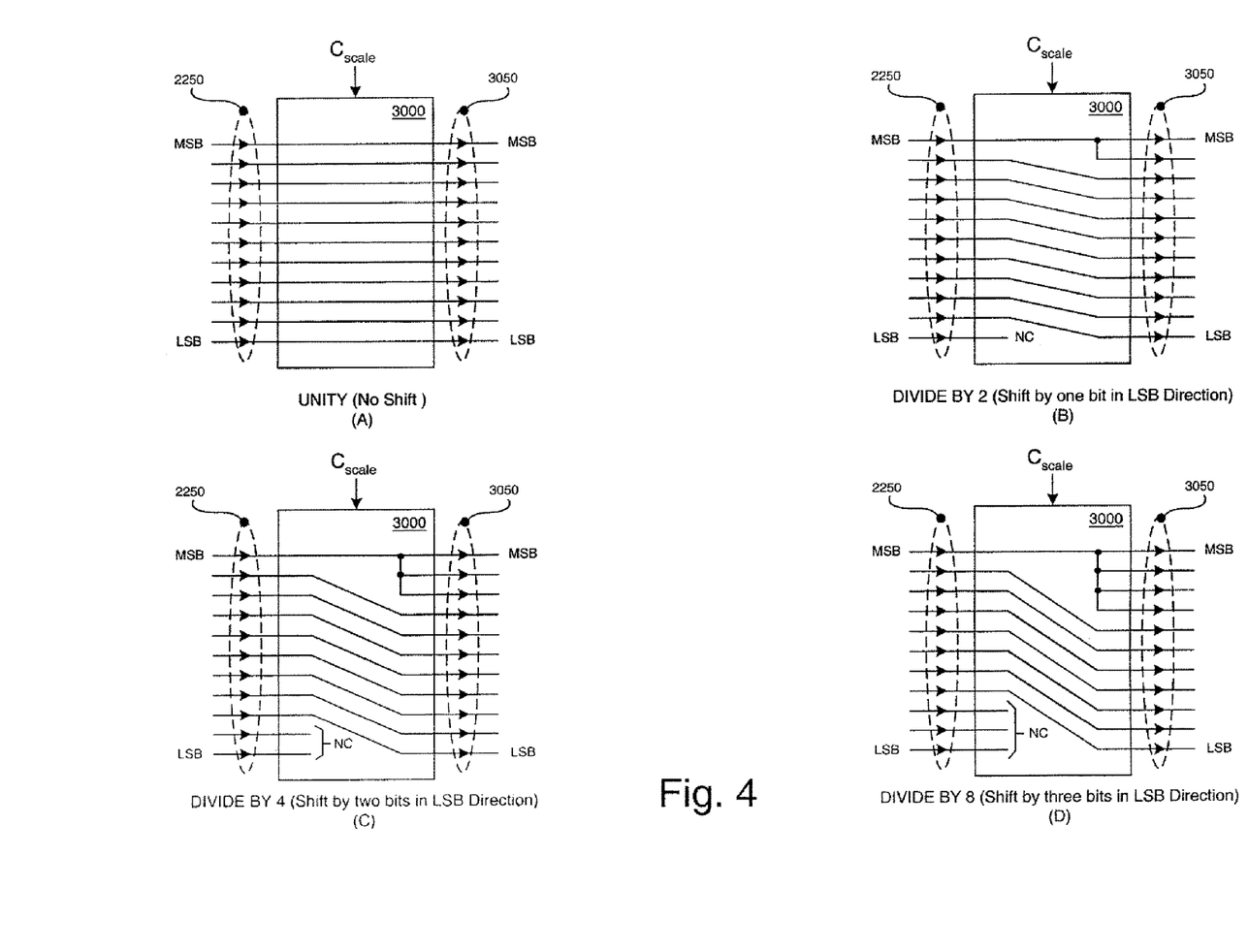
FIG. 4A illustrates the unity gain, no-shift case.
FIG. 4B illustrates a shift by one bit in the LSB direction.
FIG. 4C illustrates a shift by two bits in the LSB direction.
FIG. 4D illustrates a shift by three bits in the LSB direction.

FIGS. 4A through 4D are conceptual drawings of various shift configurations selected by control 3500. In a preferred embodiment, the scaler is implemented using AND-OR gating, but practitioners will understand that such shifting functions may be readily implemented via a variety of other techniques. FIG. 4A illustrates the unity gain, no-shift case, corresponding to small amplitude signals. FIG. 4B illustrates a shift by one bit in the LSB direction, corresponding to division by 2 (attenuation to ½ of the input magnitude). FIG. 4C illustrates a shift by two bits in the LSB direction, corresponding to division by 4 (attenuation to ¼ of the input magnitude). FIG. 4D illustrates a shift by three bits in the LSB direction, corresponding to a division by 8 (attenuation to ⅛ of the input magnitude).

Front-End Stages

Within the previously discussed digitizer portion of the tuner 1000 of FIG. 2, the received signal is oversampled by an A/D operating at $$F_{sampling} = 102.4 \text{ MHz}.$$

Figure 5:
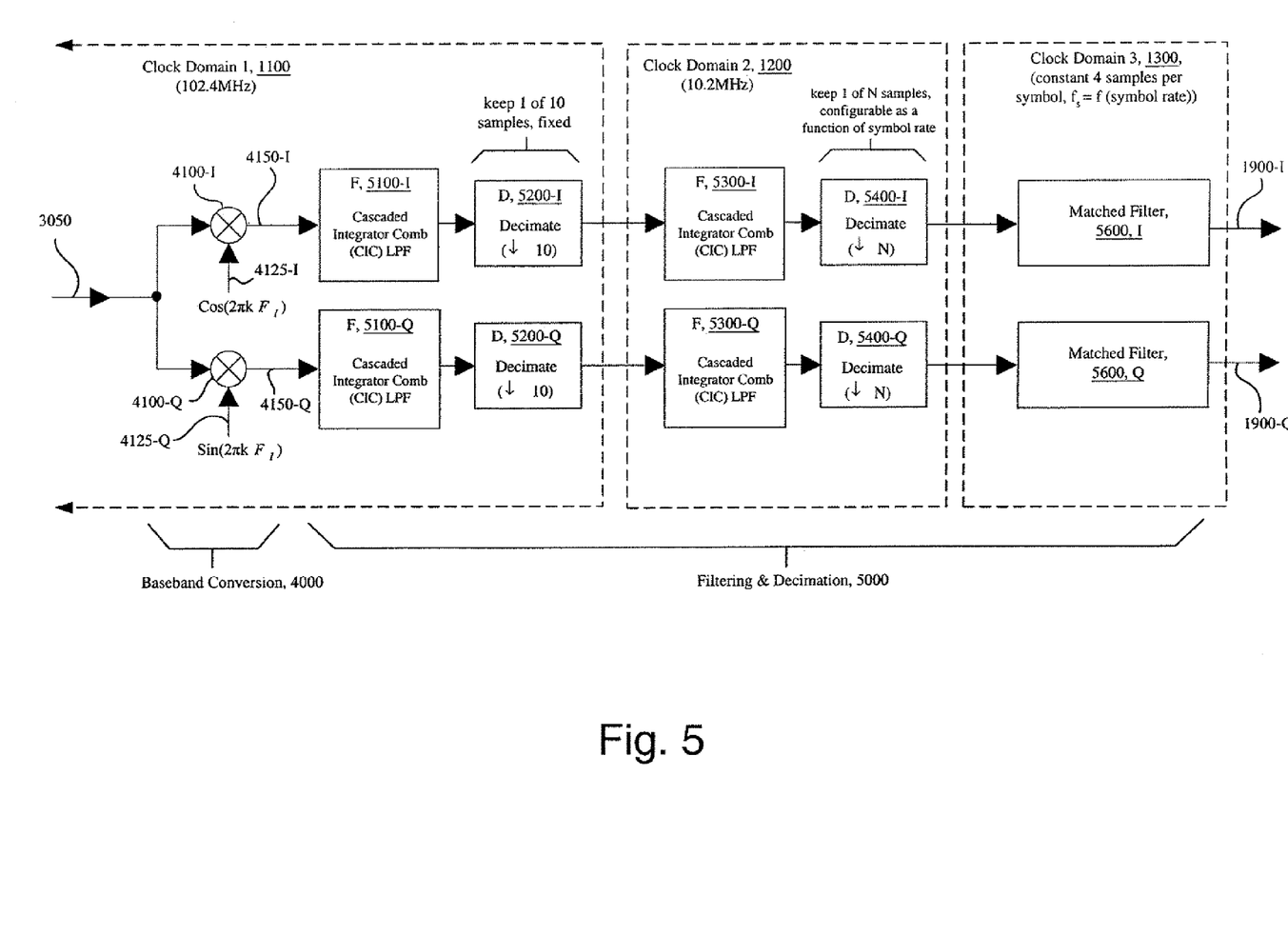
FIG. 5 illustrates the baseband conversion 4000 and filtering and decimation 5000 function blocks of a single channel in the tuner 1000 of FIG. 2.

The extent of oversampling and the specific frequency chosen are in accordance with criteria discussed in the next section below. Subsequent to the digitizer, the oversampled input is selected and scaled as discussed previously above. With reference now made to FIG. 5, the oversampled, selected, scaled, input stream 3050 is subsequently digitally down-converted within baseband conversion 4000 into baseband orthogonal component streams (4150-I and 4150-Q). This is done by parallel multiplications 4100-1 and 4100-Q of the digitized signal 3050 with the quadrature local oscillator signals 4125-I and 4125-Q, represented by the complex exponential $$e^{2j\pi k F_l T_{sampling}}$$

where $F_l$ is the nominal carrier frequency and $$T_{sampling} = 1/F_{sampling}.$$

Each of the quadrature baseband digital streams (4150-1 and 4150-Q) is then parallel processed by the Filtering and Decimation functions 5000 in respective but otherwise identically implemented filter and decimation pipelines. For each pipeline, 2 low-pass FIR (finite impulse response) filters (5100 and 5300), 2 decimators (5200 and 5400), and a matched filter 5600 are provided. The number and arrangement of the filters and decimators are chosen for reasons discussed in the next section below. However, the overall purpose of the decimators is to reduce the number of samples to a constant 4 samples per symbol period, independent of baud rate.

The purpose of the low-pass filters is to reject the image frequencies resulting from the baseband conversion and any adjacent undesired carriers. In the illustrated preferred embodiment, each low-pass filter is implemented as a cascaded integrator comb (CIC) filter. The impulse response of the CIC filter is given by $$\left( \sum_{i=0}^{N} z^{-i} \right)^D,$$

where N corresponds to the decimation factor and D to the number of cascaded integrators. With D=4, better than 50 dB of out-of-band rejection is obtained which is sufficient for the applications of the illustrated embodiments.

In a purely theoretical receiver, the matched filter of the front-end should have an impulse response exactly matched to that of the theoretical transmit filter. Both may be chosen to be identical square-root raised-cosine filters, so that their cascade provides a raised cosine Nyquist filter. Such a filter guarantees zero-ISI (zero-intersymbol interference) while minimizing the noise at the detector input. In actual implementations, the CIC filters have a known non-ideal response (it is not flat) in the pass band that can be compensated for by appropriate adjustments to the response of the matched filter. Thus in the illustrated preferred embodiment, the matched filter implements an FIR whose coefficients are those of a squared-root raised cosine filter compensated for the CIC filters attenuation.

Multi-Symbol Rate Demodulation Using a Fixed Sampling Rate

In an illustrative embodiment compatible with the DOCSIS standard, the sampling frequency is chosen to be a fixed integer multiple of all symbol rates in accordance with another aspect of the present invention. Recall that in the DOCSIS standard, each of the input coax cables may have a multiplex of carriers located in the 5-42 MHz range and that each carrier may have any symbol rate from 5 possible values (160 kBaud, 320 kBaud, 640 kBaud, 1280 kBaud, 2560 kBaud).

In particular, the sampling frequency is chosen to be an integer multiple of 4 times the symbol rates, so that 4 samples per symbol interval can be fed to the matched filter after simple decimation. Furthermore, since the multiplex on each cable has a spectrum which spans the 5-42 MHz frequency range, the sampling frequency must be higher than 84 MHz (twice the maximum frequency). All these conditions are satisfied by the previously cited sampling frequency of 102.4 MHz. This frequency corresponds to an over-sampling factor equal to 10, 20, 40, 80, 160 when the baud rate is 2560 kBaud, 1280 kBaud, 640 kBaud, 320 kBaud, 160 kBaud, respectively.

A number of options are possible in implementing the tuner's decimation from the A/D sample rate to the 4 samples per symbol interval rate. For the illustrative application, the tuner decimates by a selected total factor of 10, 20, 40, 80, or 160. It is possible to achieve these rate changes in a single stage with a configurable decimation (rate change) factor, through multiple stages of which each has a configurable decimation factor, or through multiple stages of which some have a fixed decimation factor and others have a configurable decimation factor. In multiple stage decimation approaches, the particular rate change stage partitioning (or ordering) used to accomplish the total required rate change is not crucial to the overall operation. While a particular partitioning and ordering is used in the illustrative embodiment, practitioners will realize that other partitioning and orderings are possible within the scope of the present invention.

In the embodiment illustrated in both FIG. 2 and FIG. 5, the tuner is partitioned into multiple sample-frequency clock domains. The first domain 1100 operates at the fixed A/D sample rate and includes in common the A/Ds 930 of the N digitizers 900. the baseband converters 4100, and the first decimators 5200 of the M front-ends 6000. Additional clock domains 1300 exist, including a plurality operating at selectable sub-multiples of the first domain (or second domain, if any, as discussed below) as required to deliver a constant number of symbol samples (4 in the illustrated embodiment) to each matched filter of the respective front-ends.

In an optional but preferred embodiment, a second domain 1200, including a second decimator 5400, operates at a fixed sub-multiple of the first domain. Using this preferred approach, the decimation is done in two separate steps. The first decimator 5200 operates with a constant "rate change" ratio equal to 10 (i.e., it keeps one of every 10 samples). The second decimator 5400 has a configurable rate change ratio whose value is selectable between 1 and 16, depending on the symbol rate. The dependence of the rate change ratio on the symbol rate as it is shown in Table 1.

TABLE 1

Rate Change Ratio for each Symbol Rate.

| Symbol rate (kBaud) | Total rate change ratio | $1^{st}$ stage rate change ratio | $2^{nd}$ stage rate change ratio |
|---|---|---|---|
| 160 | 160 | 10 | 16 |
| 320 | 80 | 10 | 8 |
| 640 | 40 | 10 | 4 |
| 1280 | 20 | 10 | 2 |
| 2560 | 10 | 10 | 1 |

In summary, in the illustrated embodiment only the first stages of the front-end operate at the sampling frequency of 102.4 MHz, while subsequent stages operate at 10.24 MHz, and the final stages (including the matched filter) operate at 4 times the symbol rate.

The clocking approach taught by the present invention enables producing matched front-end outputs using only simple filters and decimation, eliminates the need for interpolation stages, maximizes commonality of function, and provides reduced complexity and costs over previous approaches.

System-Level Implementation

Figure 6:
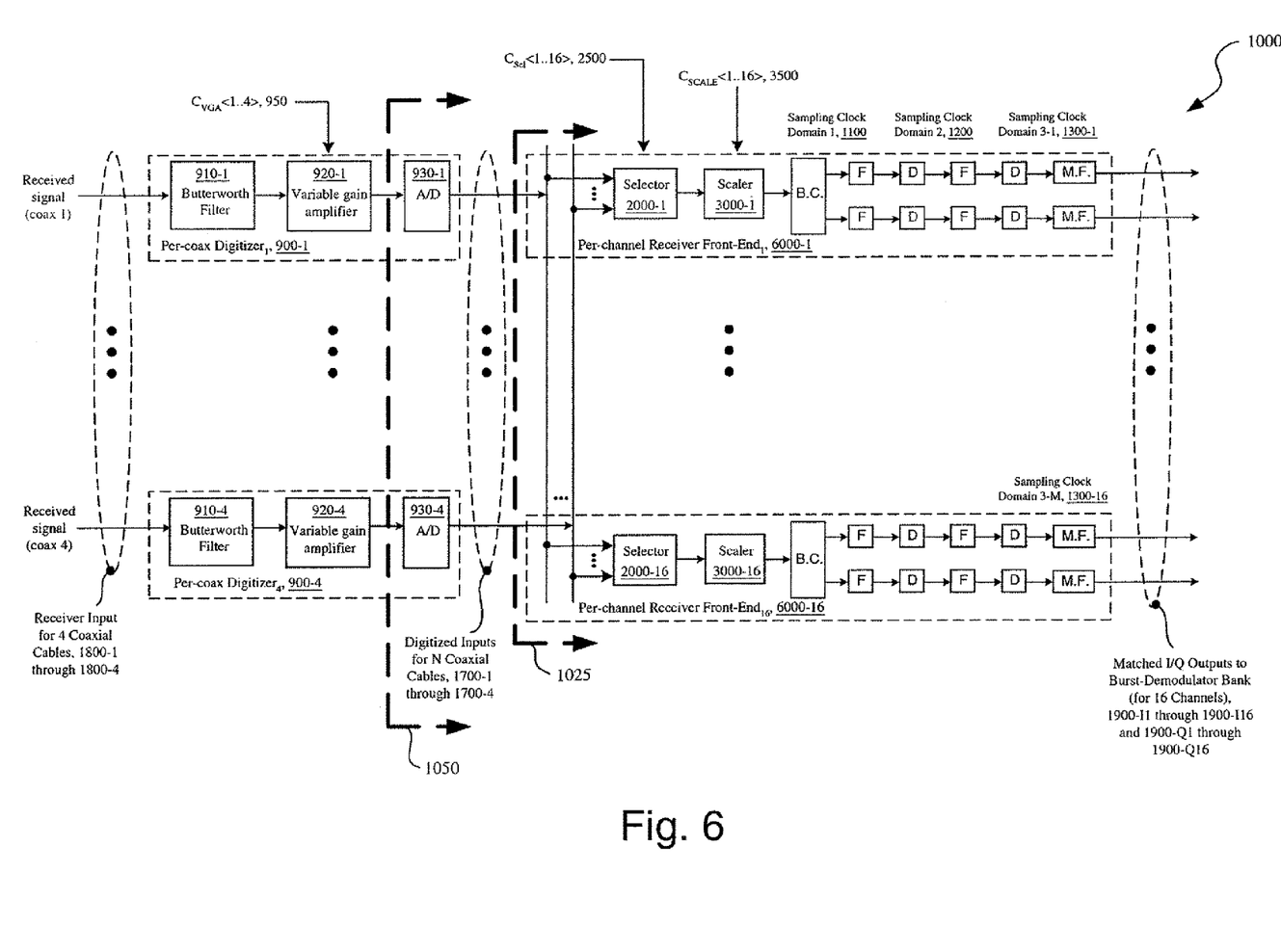
FIG. 6 illustrates preferred chip-boundary partitions for two different illustrative embodiments of the tuner 1000 of FIG. 2

FIG. 6 illustrates preferred chip-boundary partitions for two different illustrative embodiments of the tuner 1000 of FIG. 2. It is desirable to implement as much as possible of the tuner 1000 on a single integrated circuit, consistent with sound engineering and business practice. System partition 1050 corresponds to a preferred illustrative implementation, wherein all stages of the tuner following variable gain amplifier 920 are integrated on a single integrated circuit, generally with other functions. However, due to the size and complexity of the A/Ds, the more conservative system partition 1050 may be chosen.

Figure 7:
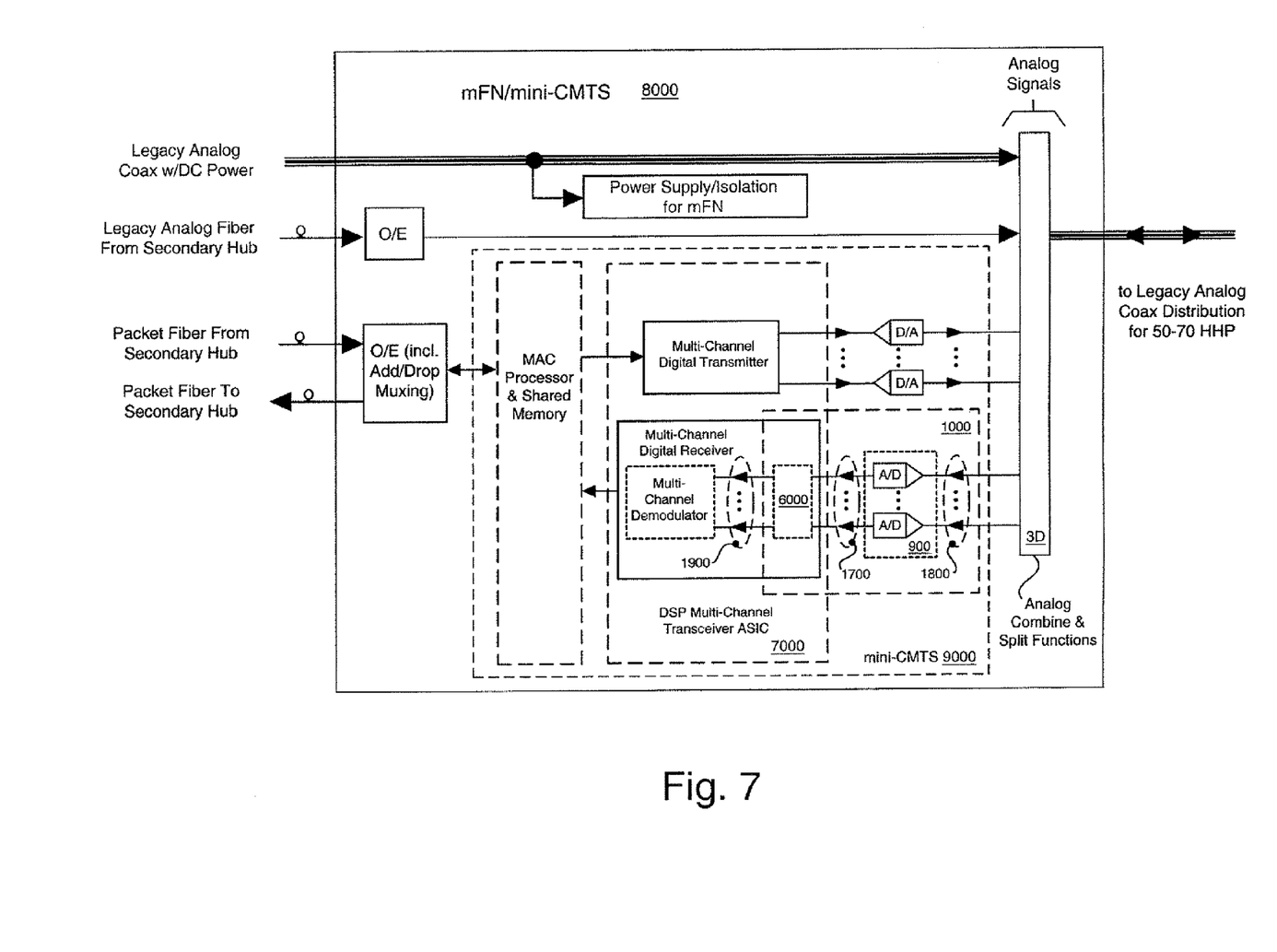
FIG. 7 illustrates a mini-Fiber-Node/mini-Cable-Modem-Termination-System (mFN/mini-CMTS) 8000 using a DSP multiple-channel transceiver ASIC 7000, which implements in silicon the multiple-channel receiver front-end 6000 portion of the tuner 1000 of FIG. 2.

FIGS. 7 and 8A-C further illustrate an exemplary system-level application of the present invention. FIG. 7 illustrates a mini-Fiber-Node/mini-Cable-Modem-Termination-System (mFN/mini-CMTS) 8000. The mini-CMTS 9000 implements a multi-channel digital receiver that employs a tuner 1000 in accordance with the present invention. Consistent with the system partition 1050 of FIG. 6., the front-end portion 6000 of the tuner is implemented on the DSP multi-channel transceiver ASIC 7000. Also implemented on the ASIC is the multi-channel demodulator portion of the digital receiver as well as the all-digital portions of a multi-channel digital transmitter. The tuner 1000 accepts multiple coax inputs 1800, delivers digitized equivalent streams 1700 from the output of digitizer portion 900, and delivers baseband converted and isolated quadrature digitized signals 1900, suitable for demodulation. The realization locally within the mFN of the CMTS functions, in general and the demodulator functions in particular, is made practical for widespread deployment by the teachings of the present invention.

Figure 8A:
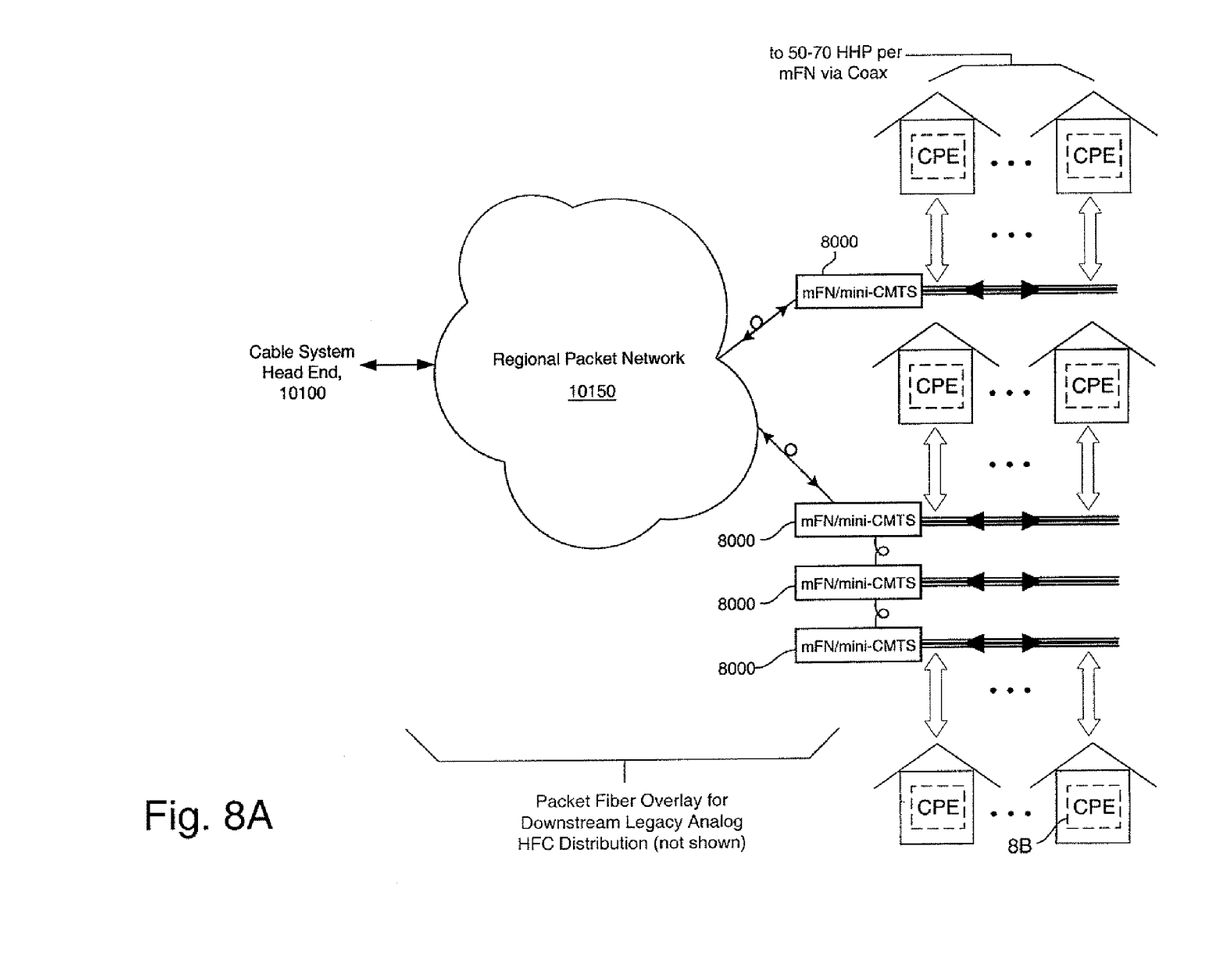
FIG. 8A provides particular detail of the routing between the Head End 10100, Regional Packet Network 10150, mFN/mini-CMTS 8000, and CPE 8B.
Figure 8B:
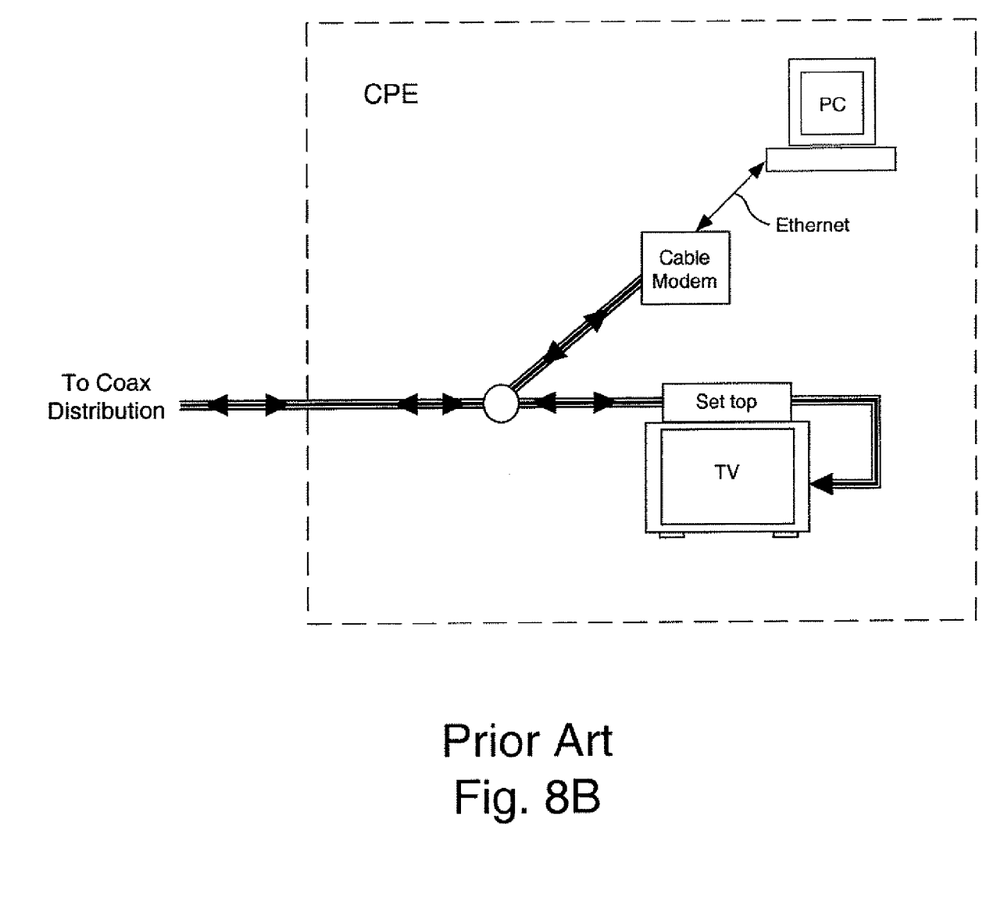
FIG. 8B provides particular detail of the CPE SB.

FIG. 8A shows the relationship between the mFN and subscribers (indicated by homes having Customer Premise Equipment, CPE) and between the mFN and the cable system head end 10100. Each mFN is coupled to up to 50 to 70 homes (50-70 Households Passed, HHP). Each mFN is coupled to the head end via a regional packet network 10150. This packet network is usually implemented as a packet fiber overlay for a downstream legacy analog HHC distribution. FIG. 8B provides detail of the CPE, which generally includes a television, the cable "set-top" box, and a cable modem for coupling the subscriber's personal computer to the network. In some systems, the CPE may additionally include an interface to a subscriber telephone.

Figure 8C:
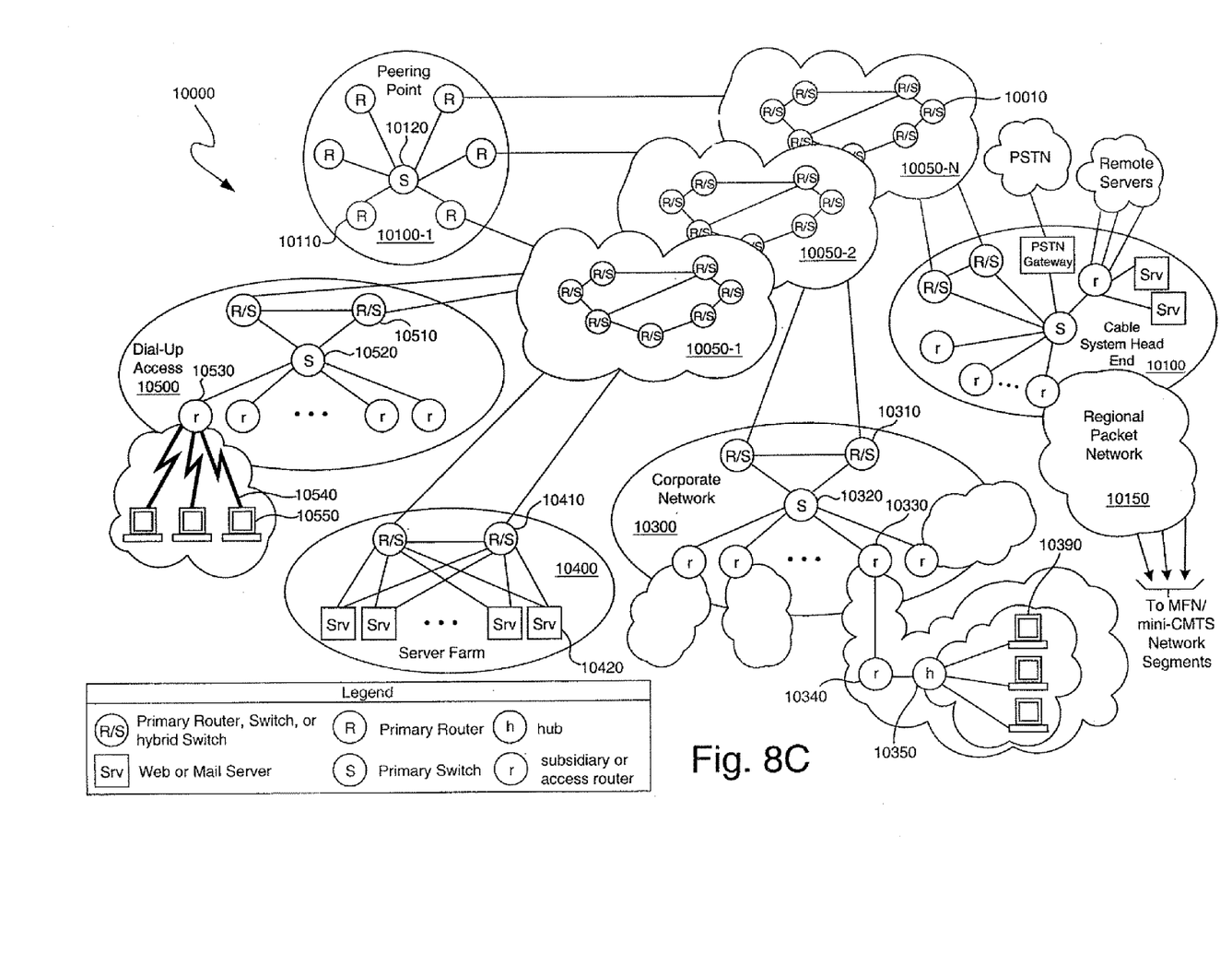
FIG. 8C provides particular detail of the routing between the Head End 10100 and the Internet 10000.

FIG. 8C shows the Head End 10100 as a component within the Internet 10000. As indicated in the legend, many subcomponents are part of this network. In this conceptual drawing, multiple backbone networks 10050-1 through 10050-N, generally operated by different long-haul communications companies, are interconnected via Peering Point 10100-1 (and other peering points not shown). Dial-up access provider 10500, Server Farm 10400, corporate network 10300, and cable system head end 10100, contract for access to the various backbone networks. Corporate end-user 10390 has network access via the associated corporate network 10300. Private end-user 10550 has access via dial-up connection 10540. Thus in the illustrated embodiments provided, cable subscribers (as indicated by homes illustrated in FIG. 8A) provide or gain access to content, services, e-mail, and other Internet resources, via a path that includes the multiple input, multiple channel output, digital tuner of the present invention.

CONCLUSION

Although the present invention has been described using particular illustrative embodiments, it will be understood that many variations in construction, arrangement and use are possible consistent with the teachings and within the scope of the invention. For example, bit-widths, clock speeds, and the type of technology used may generally be varied in each component block of the invention. Also, unless specifically stated to the contrary, the value ranges specified, the maximum and minimum values used, are merely those of the illustrative or preferred embodiments and should not be construed as limitations of the invention. Specifically, other embodiments may use different clock multiples or sub-multiples, different frequency bands, different modulation schemes, and different numbers of inputs and output channels. Functionally equivalent techniques known to those skilled in the art may be employed instead of those illustrated to implement various components or sub-systems. For example, the selector and scaler functions may be implemented using pass-gates or tri-state buffers and not just via the preferred AND-OR gating. All such variations in design comprise insubstantial changes over the teachings conveyed by the illustrative embodiments. The names given to interconnect and logic are illustrative, and should not be construed as limiting the invention. It is also understood that the invention has broad applicability to other communications and network applications, and is not limited to the particular application or industry of the illustrated embodiments. The present invention is thus to be construed as including all possible modifications and variations encompassed within the scope of the appended claims.

What is claimed is:

1. A device comprising:
a plurality of variable gain amplifiers, each variable gain amplifier coupled to an input of an analog-to-digital (A/D) converter and being configured to amplify a first plurality of input signals, an amplifier gain of the variable gain amplifier being set as a function of an entire carrier multiplex present on the first plurality of input signals;
a plurality of scalers, each scaler configured to receive a digital stream of data from the A/D converter and dynamically scale the digital stream of data to an essentially same peak magnitude, a number of variable gain amplifiers in the plurality of variable gain amplifiers being different than a number of scalers in the plurality of scalers.

2. The device of claim 1 further comprising:
a baseband converter operatively coupled to a scaler of the plurality of scalers and being configured to receive the scaled digital stream of data and digitally down-convert the scaled digital stream of data to baseband orthogonal component streams.

3. The device of claim 2 further comprising:
a plurality of filtering and decimation pipelines operatively coupled to the baseband converter and being configured to receive the baseband orthogonal component streams and process the received baseband orthogonal component streams.

4. A method comprising:
amplifying a first plurality of input signals via a variable gain amplifier, an amplifier gain of the variable gain amplifier being set as a function of an entire carrier multiplex present on the first plurality of input signals;
digitizing the amplified first plurality of input signals to create respective streams of digitized input data; and
processing one selected stream of digitized input data via one per-channel front-end of a second plurality of per-channel front-ends, the processing includes:
dynamically scaling the one selected stream of digitized input data to an essentially same peak magnitude.

5. The method of claim 4 wherein the processing one selected stream of digitized input data further includes:
down-converting the dynamically scaled stream of digitized input data to baseband orthogonal component streams.

6. The method of claim 5 wherein the processing one selected stream of digitized input data further includes:
process the baseband orthogonal component streams via filtering and decimation pipelines.

7. A digital tuner comprising:
a first plurality of digitizers providing a first plurality of digitized data streams corresponding to a first plurality of input signals; and
a second plurality of digital front-ends, at least one front-end including:
a selector to selectively couple one of the first plurality of digitized data streams to post-selector processing circuitry of the at least one front-end,
digital frequency conversion circuitry having a selectable conversion frequency from a predetermined set of conversion frequencies, and
post-conversion circuitry having a selectable decimation factor from a predetermined set of decimation factors,
wherein configuration of the digital tuner may select any arbitrary combination of one of the first plurality of input signals, one of the set of conversion frequencies, or one of the set of decimation factors.

8. The digital tuner of claim 7 wherein the configuration of the digital tuner is accomplished programmatically.

9. The digital tuner of claim 7 wherein the configuration of the digital tuner is accomplished remotely.

10. The digital tuner of claim 7 wherein the configuration of the tuner is accomplished automatically.

11. The digital tuner of claim 7 wherein the configuration of the tuner is accomplished dynamically.

12. The digital tuner of claim 7 wherein the first plurality of digitizers operate at a common first sampling rate that is an integer multiple of each decimation factor of the predetermined set of decimation factors.

13. The digital tuner of claim 7 wherein the first plurality of digitizers operate at a common first sampling rate, and
wherein each decimation factor of the predetermined set of decimation factors is an integer sub-multiple of the common first sampling rate.

14. The digital tuner of claim 7 wherein the post-conversion circuitry is implemented as a single stage having a configurable decimation factor selected from a predetermined set.

15. The digital tuner of claim 14 wherein the predetermined set includes decimation factors of 10, 20, 40, 80, and 160.

16. The digital tuner of claim 7 wherein the post-conversion circuitry is implemented as multiple stages of which some have a fixed decimation factor and others have a configurable decimation factor.

17. The digital tuner of claim 7 wherein the post-conversion circuitry is implemented using a first stage having a fixed decimation factor and a second stage having a configurable decimation factor selected from a predetermined set.

18. The digital tuner of claim 17 wherein the fixed decimation factor is 10, and
wherein the predetermined set includes decimation factors of 1, 2, 4, 8, and 16.

19. The digital tuner of claim 7 wherein the post-conversion circuitry is implemented as multiple stages of which each has a configurable decimation factor.

* * * * *